United States Patent
Iijima et al.

(10) Patent No.: US 6,983,195 B2
(45) Date of Patent: Jan. 3, 2006

(54) SEMICONDUCTOR PROCESSING SYSTEM AND METHOD OF TRANSFERRING WORKPIECE

(75) Inventors: Kiyohito Iijima, Nirasaki (JP); Shigeru Ishizawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 351 days.

(21) Appl. No.: 10/432,628

(22) PCT Filed: Dec. 6, 2001

(86) PCT No.: PCT/JP01/10674

§ 371 (c)(1),
(2), (4) Date: Jun. 9, 2003

(87) PCT Pub. No.: WO02/47153

PCT Pub. Date: Jun. 13, 2002

(65) Prior Publication Data
US 2004/0029300 A1    Feb. 12, 2004

(30) Foreign Application Priority Data
Dec. 8, 2000  (JP) .............................. 2000-375207

(51) Int. Cl.
*G06F 7/00*   (2006.01)

(52) U.S. Cl. ...................................... 700/218

(58) Field of Classification Search ................ 700/213, 700/214, 218; 414/805, 806, 816, 935, 936, 414/939
See application file for complete search history.

(56) References Cited

U.S. PATENT DOCUMENTS

| | | | | |
|---|---|---|---|---|
| 5,928,389 A | * | 7/1999 | Jevtic | 29/25.01 |
| 6,122,566 A | * | 9/2000 | Nguyen et al. | 700/218 |
| 6,510,365 B1 | * | 1/2003 | Nishinakayama et al. | 700/214 |
| 6,665,584 B1 | * | 12/2003 | Malitsky et al. | 700/218 |
| 6,698,944 B2 | * | 3/2004 | Fujita | 396/611 |
| 6,742,980 B2 | * | 6/2004 | Sasaki | 414/783 |

FOREIGN PATENT DOCUMENTS

| | | |
|---|---|---|
| EP | 837494 | 4/1998 |
| JP | 7-193112 | 7/1995 |
| JP | 09-252039 | 9/1997 |
| JP | 2000-127089 | 5/2000 |
| JP | 2000-332083 | 11/2000 |
| JP | 2001-358195 | 12/2001 |
| JP | 2001-385195 | 12/2001 |

* cited by examiner

*Primary Examiner*—Khoi H. Tran
(74) *Attorney, Agent, or Firm*—Oblon, Spivak, McClelland, Maier & Neustadt, P.C.

(57) ABSTRACT

A semiconductor processing system has processing apparatuses (24A, 24B), waiting ports (36A, 36B, 36C), a common transfer mechanism (40), and a control section (94). The control section (94) performs information processing, using a remaining process time and total transfer time, while a first target object is processed in a first one of the processing apparatuses (24A, 24B). The remaining process time is a time to complete a process on the first target object in the first processing apparatus, and to make the first target object ready for transfer from the first processing apparatus. The total transfer time is a time to take out a target object from a first one of the waiting ports (36A, 36B, 36C), and to transfer the target object to the waiting position for the first processing apparatus. The control section (94) starts transferring a new target object from the first waiting port toward the waiting position for the first processing apparatus, based on a result of the information processing.

13 Claims, 6 Drawing Sheets

SEMICONDUCTOR PROCESSING SYSTEM AND METHOD OF TRANSFERRING WORKPIECE

TECHNICAL FIELD

The present invention relates to a processing system for subjecting a target object, such as a semiconductor wafer, to a predetermined process, and a method of transferring a target object in a processing system. The term "semiconductor process" used herein includes processes of various kinds which are performed to manufacture a semiconductor device or a structure having wiring layers, electrodes, and the like to be connected to a semiconductor device, on a target object, such as a semiconductor wafer or an LCD substrate, by forming semiconductor layers, insulating layers, and conductive layers in predetermined patterns on the target object.

BACKGROUND ART

In general, a system for manufacturing semiconductor devices is structured by combining processing apparatuses of various kinds. A transfer mechanism is arranged to automatically transfer wafers between the processing apparatuses, and between the processing apparatuses and a cassette for storing a number of wafers. For example, the transfer mechanism has a transfer arm, which is extensible/contractible, swingable, and movable up and down. The transfer arm is horizontally moved to a delivery position to transfer and deliver a wafer to a predetermined position. Examples of such a system structured by combining processing apparatuses of various kinds are disclosed in, e.g., Jpn. Pat. Appln. KOKAI Publications Nos. 7-193112, 9-252039, and 2000-127069.

FIG. 7 is a structural diagram schematically showing a processing system of this kind. As shown in FIG. 7, the processing system has a laterally long box-like common transfer chamber 2. A plurality of, e.g., three in this example, waiting ports 4A, 4B, and 4C are disposed on one side along the longitudinal direction of the common transfer chamber 2. Each of the waiting ports 4A, 4B, and 4C is structured to place one cassette container 6 therein on standby. The cassette container 6 can accommodate a plurality of, e.g., 25, unprocessed wafers W with intervals therebetween in the vertical direction.

A plurality of processing apparatuses, e.g., processing apparatuses 10A and 10B in this example, having load-lock chambers 8A and 8B, which can be vacuum-exhausted, are disposed on the side opposite the waiting ports 4A to 4C. For example, the processing apparatuses 10A and 10B are arranged to perform different processes. In each of the load-lock chambers 8A and 8B, two buffer tables 12A or 12B and an individual transfer mechanism 14A or 14B are disposed, so that wafers can be transferred between the processing apparatus 10A or 10B and common transfer chamber 2.

An orientor 16 is disposed at one end of the common transfer chamber 2 to correct a displacement of a wafer, thereby performing alignment of the wafer. A common transfer mechanism 18 is disposed in the common transfer chamber 2 to be movable in its longitudinal direction (X direction). The common transfer mechanism 18 has two transfer arms 20A and 20B, which can be independently controlled to extend/contract, swing, and move up and down. The two transfer arms 20A and 20B are used to perform wafer replacement.

In the processing system described above, an unprocessed wafer W is first transferred from the cassette container 6 in one of the waiting ports 4A to 4C to the orientor 16 by one of the transfer arms, e.g., the arm 20A, of the common transfer mechanism 18. In the orientor 16, the other empty transfer arm, e.g., the arm 20B, is used to pick up a wafer already aligned, so as to replace it with the unprocessed wafer W. The wafer already aligned is transferred to the load-lock chamber of a predetermined processing apparatus, e.g., the load-lock chamber 8A of the apparatus 10A, for performing a necessary process.

A wafer processed in the processing apparatus 10A is transferred into the load-lock chamber 8A. The processed wafer is replaced with the unprocessed wafer having been transferred, as described above, in the load-lock chamber 8A. The unprocessed wafer is transferred into the processing apparatus 10A to be subject to a predetermined process. The processed wafer is returned into the original cassette container 6 by the common transfer mechanism 18.

In such a processing system, it is generally preferable that an unprocessed wafer is placed on standby closely to the processing apparatus 10A or 10B as far as possible, in light of improvement in throughput. Accordingly, unprocessed wafers are sequentially transferred from the cassette container 6, and are respectively placed on standby in the orientor 16, on one of the transfer arms of the common transfer mechanism 18 (the other transfer arm is empty for wafer replacement), and on one of the buffer tables 12A closer to the processing apparatus 10A in the load-lock chamber 8A. When the process on one wafer is complete, the processed wafer is immediately returned into the cassette container. On the other hand, the standby unprocessed wafers are sent in order, so that the next unprocessed wafer is transferred into the processing step.

In this situation, it is assumed that, for example, a cassette container storing new unprocessed wafers is placed in an empty waiting port, e.g., 4C, in order to subject them to the process in another processing apparatus 10B, which is different from that in the processing apparatus 10A. In this case, although the other processing apparatus 10B is not in operation, one of the transfer arms 20A and 20B of the common transfer mechanism 18 holds a wafer that has already undergone alignment. Furthermore, a wafer is also placed in the orientor 16. Consequently, processing of the new wafers placed in the waiting port 4C cannot begin until the current processing executed by the apparatus 10A is complete. In this case, a problem arises in that the rate of operation of the other processing apparatus 10B decreases, thereby hindering improvement in throughput.

In order to solve this problem, it may be adopted that no unprocessed wafers are transferred from the cassette container 6 or placed on standby in the wafer transfer route, until the processing of the current wafer is complete and the wafer is ready for transfer. However, in this case, it takes a long time for an unprocessed wafer to be aligned by the orientor 16, and transferred to a position immediately in front of the processing apparatus 10A. This lowers the throughput of the processing apparatus 10A contrary to the purpose.

As described above, although wafers to be subjected to another process are ready for transfer, the common transfer mechanism 18 and orientor 16 are occupied by wafers to be subjected to the preceding process. Consequently, the wafers to be subjected to the other process cannot be transferred, which lowers the total throughput. Particularly, it is necessary to perform processes of various kinds on a small number of wafers in recent years. Under the circumstances, this problem should be solved as soon as possible.

DISCLOSURE OF INVENTION

The present invention has been made, in consideration of the problems described above, to effectively solve them. An object of the present invention is to provide a processing system and a method of transferring a target object in a processing system that improve the total throughput. According to the present invention, a remaining process time of a target object currently processed is administered, so that, when a target object to be subjected to a different process appears, it can be swiftly and efficiently transferred to a processing apparatus.

According to a first aspect of the present invention, there is provided a method of transferring a target object in a semiconductor processing system, the system including a plurality of processing apparatuses configured to subject target objects to processes of different kinds, a plurality of waiting ports configured to put the target objects on standby, an alignment device configured to subject the target objects to alignment, and a common transfer mechanism configured to transfer the target objects between the plurality of processing apparatuses, the plurality of waiting ports, and the alignment device, the method comprising, while a first target object is processed in a first processing apparatus, as one of the processing apparatuses:

performing information processing, using a remaining process time to complete a process on the first target object in the first processing apparatus, and to make the first target object ready for transfer from the first processing apparatus, and a total transfer time, which includes a first partial transfer time to transfer one of the target objects from a first waiting port, as one of the waiting ports, to the alignment device, and a second partial transfer time to transfer one of the target objects from the alignment device to a waiting position for the first processing apparatus; and starting transfer of a new target object from the first waiting port toward the waiting position for the first processing apparatus, based on a result of the information processing.

According to a second aspect of the present invention, there is provided a method of transferring a target object in a semiconductor processing system, the system including a plurality of processing apparatuses configured to subject target objects to processes of different kinds, a plurality of waiting ports configured to put the target objects on standby, and a common transfer mechanism configured to transfer the target objects between the plurality of processing apparatuses and the plurality of waiting ports, the method comprising, while a first target object is processed in a first processing apparatus, as one of the processing apparatuses:

performing information processing, using a remaining process time to complete a process on the first target object in the first processing apparatus, and to make the first target object ready for transfer from the first processing apparatus, and a total transfer time to take out one of the target objects from a first waiting port, as one of the waiting ports, and to transfer the one of the target objects to a waiting position for the first processing apparatus; and starting transfer of a new target object from the first waiting port toward the waiting position for the first processing apparatus, based on a result of the information processing.

According to a third aspect of the present invention, there is provided a semiconductor processing system, comprising:

a plurality of processing apparatuses configured to subject target objects to processes of different kinds;

a plurality of waiting ports configured to put the target objects on standby;

an alignment device configured to subject the target objects to alignment;

a common transfer mechanism configured to transfer the target objects between the plurality of processing apparatuses, the plurality of waiting ports, and the alignment device; and a control section configured to control operations of the common transfer mechanism, wherein the control section comprises, while a first target object is processed in a first processing apparatus, as one of the processing apparatuses, performing information processing, using a remaining process time to complete a process on the first target object in the first processing apparatus, and to make the first target object ready for transfer from the first processing apparatus, and a total transfer time, which includes a first partial transfer time to transfer one of the target objects from a first waiting port, as one of the waiting ports, to the alignment device, and a second partial transfer time to transfer one of the target objects from the alignment device to a waiting position for the first processing apparatus, and starting transfer of a new target object from the first waiting port toward the waiting position for the first processing apparatus, based on a result of the information processing.

According to a fourth aspect of the present invention, there is provided a semiconductor processing system, comprising:

a plurality of processing apparatuses configured to subject target objects to processes of different kinds;

a plurality of waiting ports configured to put the target objects on standby;

a common transfer mechanism configured to transfer the target objects between the plurality of processing apparatuses and the plurality of waiting ports; and a control section configured to control operations of the common transfer mechanism, wherein the control section comprises, while a first target object is processed in a first processing apparatus, as one of the processing apparatuses, performing information processing, using a remaining process time to complete a process on the first target object in the first processing apparatus, and to make the first target object ready for transfer from the first processing apparatus, and a total transfer time to take out one of the target objects from a first waiting port, as one of the waiting ports, and to transfer the one of the target objects to a waiting position for the first processing apparatus, and starting transfer of a new target object from the first waiting port toward the waiting position for the first processing apparatus, based on a result of the information processing.

In the first to forth aspects, the information processing may be performed by comparing a value representing difference or ratio between the remaining process time and the total transfer time with a preset value.

According to the first to forth aspects, there is almost no such a waste of time that the common transfer mechanism stays on standby along with an unprocessed target object held thereon, so that the throughput remarkably improves as a whole.

BEST MODE FOR CARRYING OUT THE INVENTION

Figure 1:
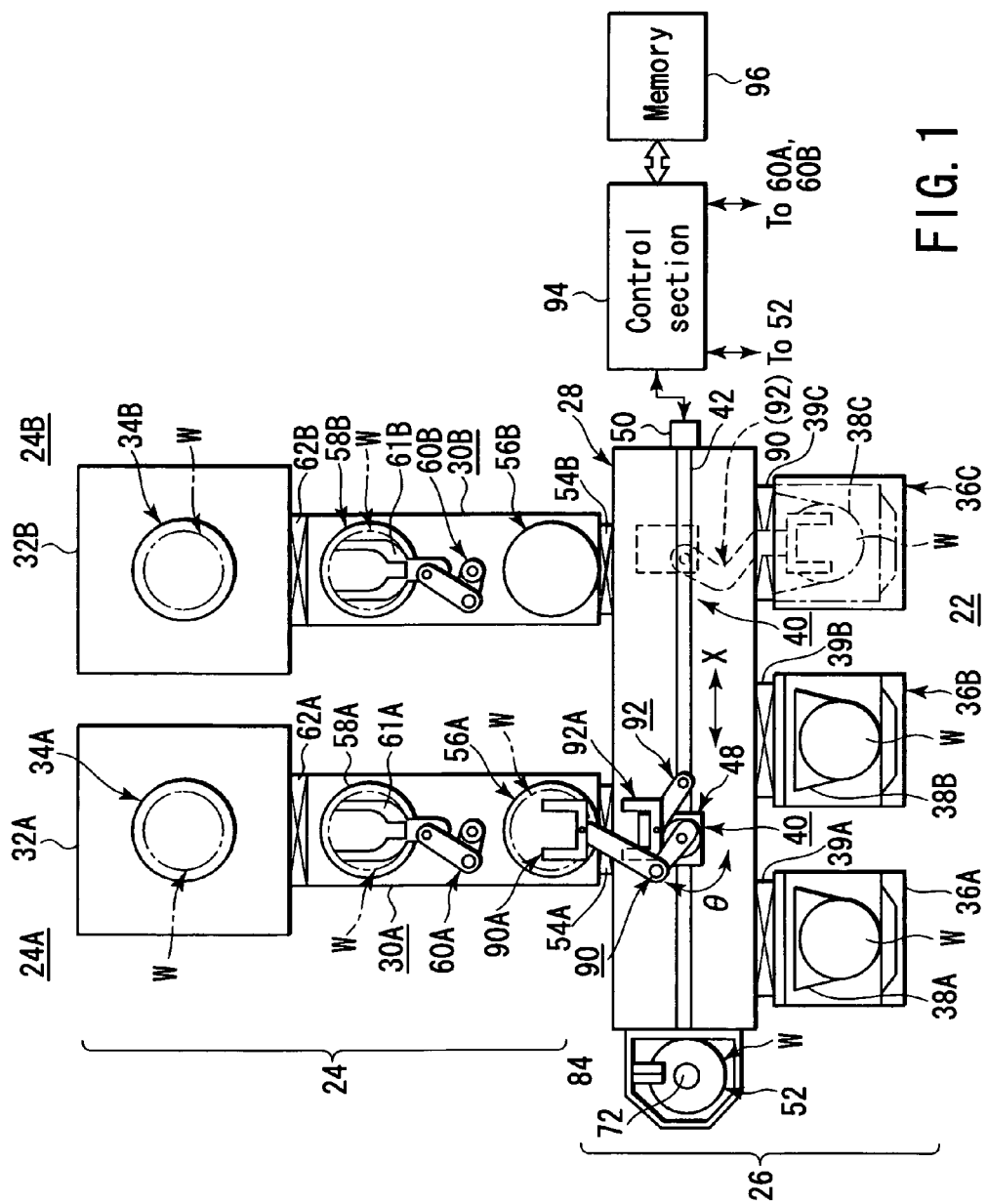
FIG. 1 is a structural diagram schematically showing a semiconductor processing system for processing a target object, according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a structural diagram schematically showing a semiconductor processing system for processing a target object, according to an embodiment of the present invention. First, an explanation will be given of this semiconductor processing system for processing a target object, with reference to FIG. 1. The processing system 22 is constituted mainly of a processing section 24 for subjecting a target object or semiconductor wafer W to various semiconductor processes, such as a film-formation process and an etching process, and a transfer section 26 for transferring wafers W to and from the processing section 24. The transfer section 26 has a common transfer chamber 28 used for transferring wafers W in common.

The processing section 24 has two processing apparatuses 24A and 24B. The processing apparatuses 24A and 24B respectively have process chambers 32A and 32B, and load-lock chambers 30A and 30B connected thereto, which can be vacuum-exhausted. The process chambers 32A and 32B are arranged to perform different semiconductor processes on wafers W. The process chambers 32A and 32B respectively have worktables 34A and 34B disposed therein for placing a wafer W. The number of processing apparatuses, each of which is formed of the load-lock chamber and process chamber, is not limited to two, but may be three or more.

The transfer section 26 has a common transfer chamber 28 formed of a laterally long box, in which an inactive gas, such as $N_2$ gas, or clean air is circulated. A plurality of, e.g., three in this embodiment, waiting ports or cassette tables 36A, 36B, and 36C are disposed for respectively placing cassette containers, along one longitudinal side of the common transfer chamber 28. The cassette tables 36A, 36B, and 36C respectively accommodate the cassette containers 38A to 38C. In FIG. 1, the cassette container 18C on the cassette table 36C on the right side is shown with one-dot chain line, which denotes that the cassette table 36C is currently empty. Each of the cassette containers 38A to 38C can accommodate a plurality of, e.g., 25 at most, wafers W with intervals therebetween in the vertical direction. Each cassette container has an airtight structure, the inside of which is filled with, e.g., $N_2$ gas. There are gate valves 39A to 39C between the cassette containers 38A to 38C and common transfer chamber 28, so that wafers can be transferred between them.

A common transfer mechanism 40 is disposed in the common transfer chamber 28 to transfer wafers W in its longitudinal direction. The common transfer mechanism 40 is fixed on a base 48, which is slidably supported on a guide rail 42 extending in the longitudinal direction of the common transfer chamber 28 at the center. The base 48 and guide rail 42 are respectively provided with the movable part and stationary part of a linear motor. Accordingly, the common transfer mechanism 40 is moved along the guide rail 42 in the X direction by a driver mechanism 50 for the linear motor, disposed at an end of the guide rail 42.

An alignment device or orientor 52 is disposed at the other end of the common transfer chamber 28 to perform alignment of a wafer. The two load-lock chambers 30A and 30B described above, which can be vacuum-exhausted, are disposed to connect a longitudinal side of the common transfer chamber 28 to the two process chambers 32A and 32B, thorough gate valves 54A and 54B, which can be respectively opened/closed. In each of the load-lock chambers 30A and 30B, a pair of buffer tables 56A and 58A or 56B and 58B are disposed, so that wafers W are respectively and temporarily placed on standby. The buffer tables 56A and 56B on the common transfer chamber 28 side will be referred to as first buffer tables, and the buffer tables 58A and 58B on the other side as second buffer tables.

Individual transfer mechanisms 60A and 60B, each comprising an articulated arm, which is extensible/contractible, swingable, and movable up and down, are respectively disposed at positions between the buffer tables 56A and 58A and between the buffer tables 56B and 58B. Each individual transfer mechanism 60A or 60B has a fork 61A or 61B at its distal end, by which a wafer W is transferred between first and second buffer tables 56A and 58A or 56B and 58B. The other ends of the load-lock chambers 30A and 30B are connected to the process chambers 32A and 32B through gate valves 62A and 62B, which can be respectively opened/closed. The individual transfer mechanism 60A and 60B are also used to transfer wafers to and from the process chambers 32A and 32B.

Figure 2:
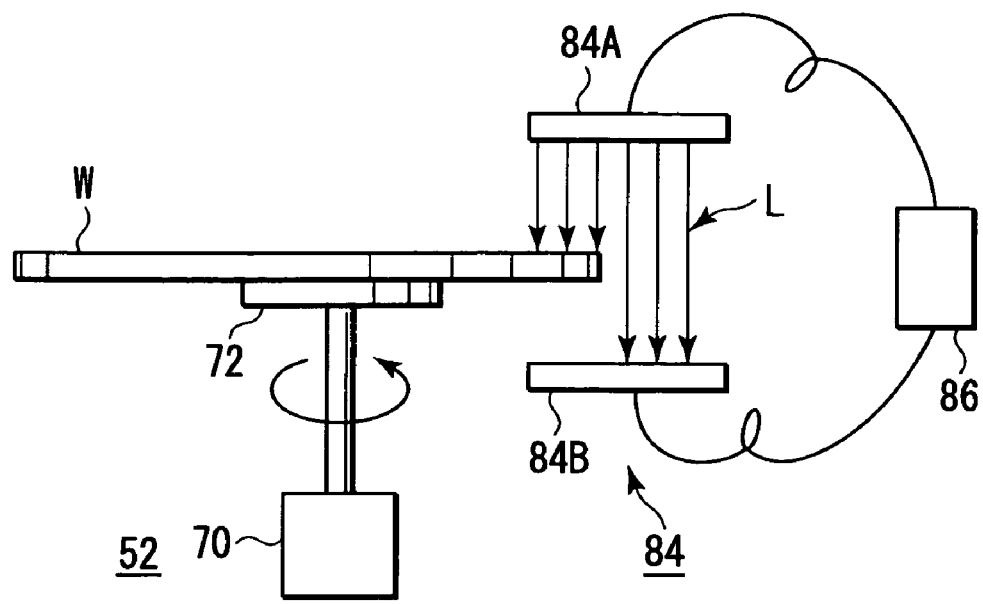
FIG. 2 is a side view showing an alignment device used in the system shown in FIG. 1.
Figure 3:
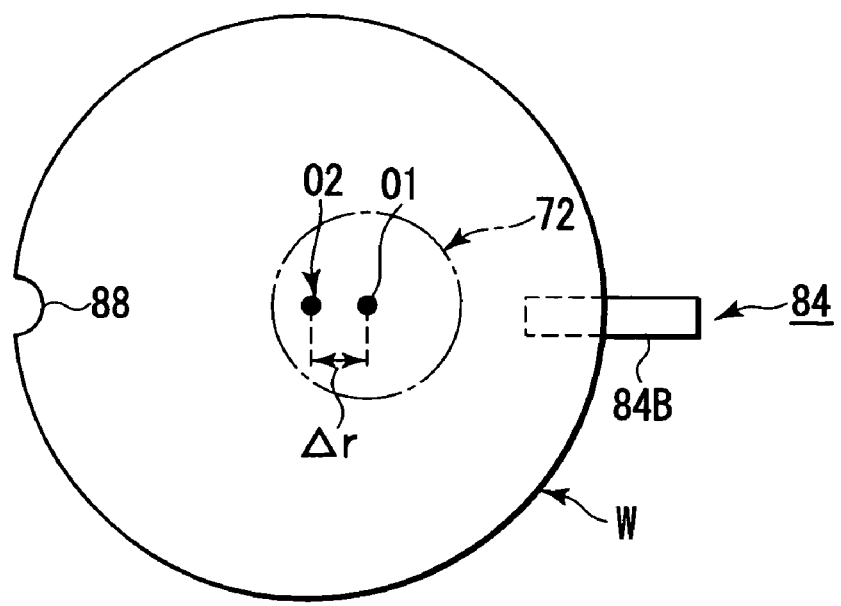
FIG. 3 is a plan view showing a state where a target object is placed on the alignment device shown in FIG. 2.

FIG. 2 is a side view showing an alignment device used in the system shown in FIG. 1. FIG. 3 is a plan view showing a state where a target object is placed on the alignment device shown in FIG. 2. As shown in FIGS. 2 and 3 as well, the orientor 52 has a reference table 72 rotated by a driving motor 70, along with a wafer W placed thereon. An optical sensor 84 is disposed beside the reference table 72 to detect the peripheral edge of the wafer W. The optical sensor 84 comprises a linear light-emitting element 84A having a predetermined length and disposed along the radial direction of the reference table 72, and a light-receiving element 84B facing the light-emitting element 84A with the wafer peripheral edge interposed therebetween. The optical sensor 84 radiates a curtain-like laser light L onto the wafer peripheral edge to detect a change caused therein. A detection and arithmetic section 86 is arranged to identify the decentering amount and decentering direction of the wafer W, and the rotational position or orientation of a cut mark, e.g., notch 88, formed in the wafer W.

In FIG. 3, O1 denotes the center (rotational center) of the reference table 72, and O2 denotes the center of the wafer W. Accordingly, the decentering amount is Δr, in this case. As regards cut marks, wafers of 300 mm employ a notch 88, and wafers of 8 inch or 6 inch employ a notch or orientation flat.

Back to FIG. 1, the common transfer mechanism 40 has two articulated transfer arms 90 and 92 disposed at two height levels. Each of the transfer arms 90 and 92 has a bifurcated fork 90A or 92A at its distal end, by which a wafer W is directly held. The transfer arms 90 and 92 are extensible/contractible in an R direction, i.e., a radial direction from the center. The transfer arms 90 and 92 can be independently controlled to extend/contract.

The rotational axes of the transfer arms 90 and 92 are coaxially and rotatably connected to the base 48. The rotational axes can be integratedly rotated in, e.g., a θ direction, which is the swing direction relative to the base 48. The rotational axes can be integratedly moved in a Z direction, which is the vertical direction relative to the base 48. Accordingly, all the coordinate positions can be expressed with X, Z, R, and θ coordinates. The coordinates of the axes are recognized by, e.g., an encoder. It should be noted that the common transfer mechanism 40 is not limited to a structure with transfer arms 90 and 92 disposed at two height levels to overlap with each other.

A control section 94 formed of, e.g., a microcomputer is arranged to control the entire operation of the processing system, including operations of the orientor 52, common transfer mechanism 40, and individual transfer mechanisms 60A and 60B. The control section 94 is provided with a memory 96 for storing various data. Based on instructions from the control section 94, the timing to start transferring a wafer is determined, as described later.

Figure 4:
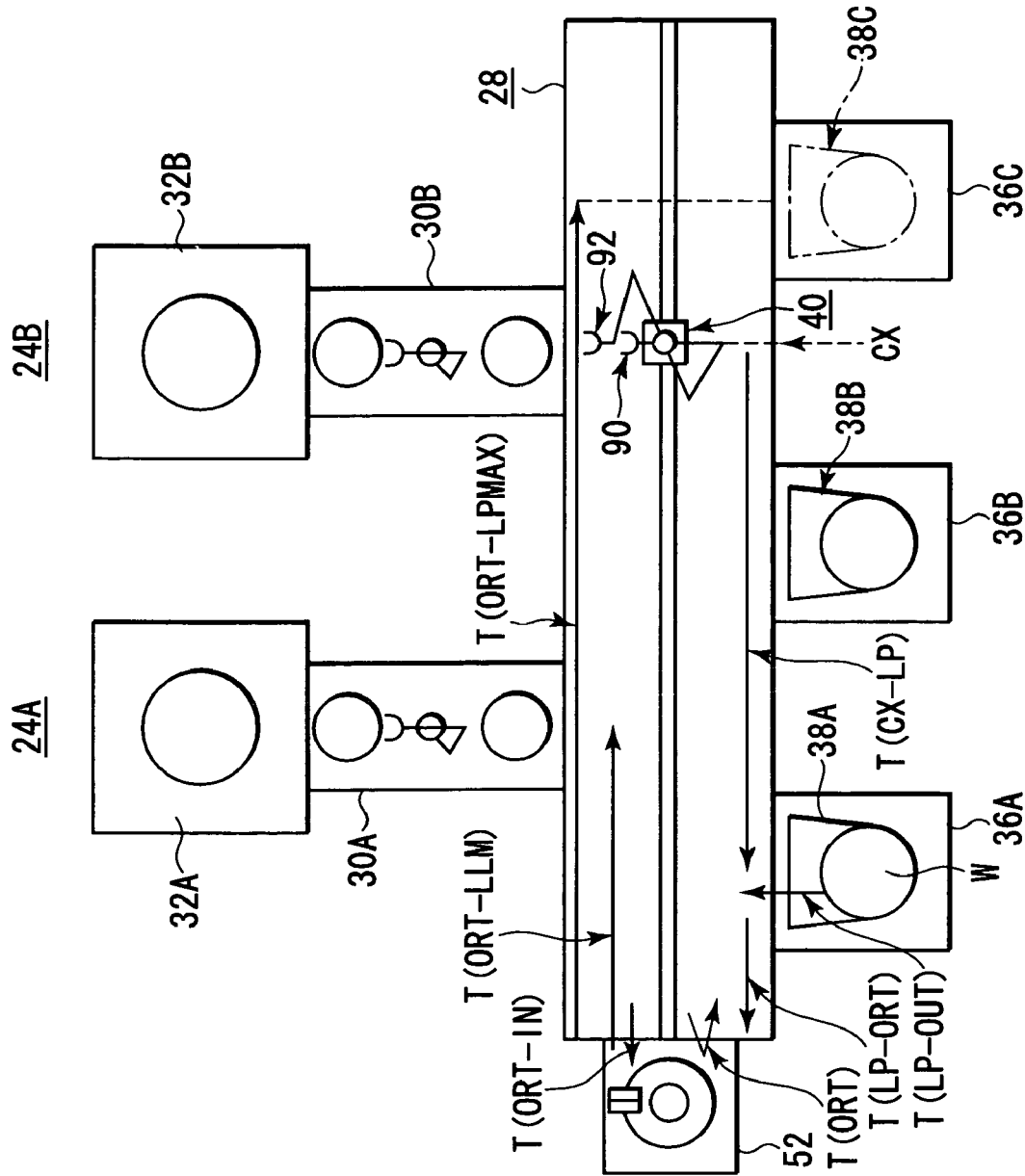
FIG. 4 is a view used for defining periods of time necessary for steps in a transfer route in the system shown in FIG. 1.
Figure 5:
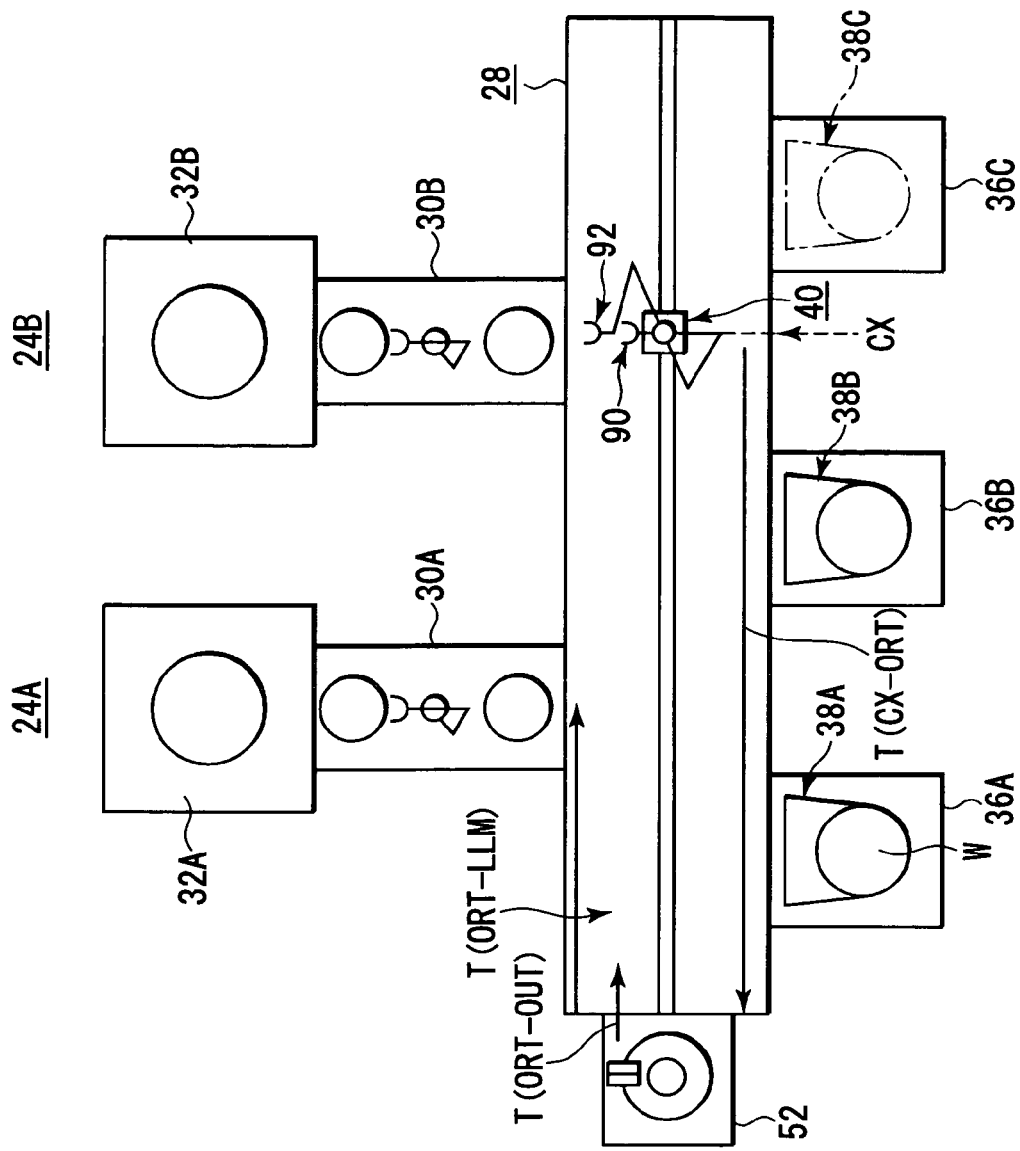
FIG. 5 is a view used for defining periods of time necessary for steps in another transfer route in the system shown in FIG. 1.

An explanation will be given of a transfer method, which utilizes the processing system 22 described above, according an embodiment of the present invention, with reference to FIGS. 4 and 5 as well. FIG. 4 is a view used for defining periods of time necessary for steps in transferring a wafer from a cassette container. FIG. 5 is a view used for defining periods of time necessary for steps in transferring a wafer from the orientor 52. The transfer shown in FIG. 5 is conducted only when no wafer is present in any cassette container.

It is assumed that, when a wafer from a specific cassette container is being transferred, a new cassette container is placed to set wafers to be subjected to another process. In this case, if the wafer in transfer occupies the orientor 52 or common transfer mechanism 40, a wafer for the other process cannot be transferred until the processing of the current wafer is complete. This brings about a delay in the other process.

In a transfer method according to the present invention, information processing is performed, using a remaining process time necessary until the processing of the current wafer is complete and the wafer is ready for transfer from the processing apparatus, i.e., from the corresponding load-lock chamber, and a total transfer time necessary until the next unprocessed wafer is transferred to the load-lock chamber. Then, based on the result of the information processing, the timing to start transferring a wafer from the cassette container or orientor 52 is determined. In other words, the timing to start transferring a wafer from the cassette container or orientor 52 is delayed, as much as temporally possible without lowering the throughput.

Because the remaining process time is defined as described above, this includes, in addition to a remaining period of time to actually perform a process on a wafer in a process chamber, a period of time to adjust the pressure in the process chamber relative to the load-lock chamber and transfer the processed wafer to the load-lock chamber, and a period of time to airtightly close the load-lock chamber and adjust the pressure in the load-lock chamber relative to the common transfer chamber 28 (almost atmospheric pressure) so as to be ready for transfer of the processed wafer into the common transfer chamber 28. The process time on a wafer is predetermined, while the remaining process time is measured by the control section 94, and gradually decreases with progress of the process.

Judgment on determining the timing to start transferring a wafer from the cassette container or orientor 52 is performed at intervals of, e.g., one second, predetermined by a program stored in the control section 94.

Next, an explanation will be given of definition of periods of time necessary for steps in transferring a wafer, with reference to FIGS. 4 and 5. This explanation is based on an example in which an unprocessed wafer W is picked up from the cassette container 38A on the cassette table 36A, which is the leftmost waiting port in FIG. 4, and is subjected to alignment by the orientor 52, and then the wafer is transferred to the left load-lock chamber 30A, and is processed in the processing apparatus 24A. In FIGS. 4 and 5, "CX" denotes the current position of the common transfer mechanism 40.

<Definition of Respective Times (FIG. 4)>

(1) T(CX-LP): a travel time (initial travel time) from the current position CX to the cassette table (load port) 36A.

(2) T(LP-ORT): a travel time (first partial transfer time) from the cassette table 36A to the orientor 52.

(3) T(ORT-LLM): a travel time (second partial transfer time) from the orientor 52 to the load-lock chamber (load-lock module) 30A (waiting position).

(4) T(LP-OUT): a pickup time to pick up a wafer from the cassette table 36A.

(5) T(ORT): a replacement time to replace an aligned wafer with a non-aligned wafer in the orientor 52 while transferring the wafers thereto/therefrom.

(6) T(ORT-IN): an insertion time to insert a non-aligned wafer into the orientor 52.

(7) T(ORT-LPMAX): a travel time from the orientor 52 to the farthest cassette table (36C in this case).

<Definition of Respective Times (FIG. 5)>

(1) T(CX-ORT): a travel time from the current position CX to the orientor 52.

(2) T(ORT-OUT): a pickup time to pick up an aligned wafer from the orientor 52.

(3) T(ORT-LLM): a travel time (second partial transfer time) from the orientor 52 to the load-lock chamber (load-lock module) 30A (waiting position). This is the same as T(ORT-LLM) in FIG. 4.

Although the values of the respective times depend on the length of the common transfer chamber 28, they fall in a range of, e.g., several seconds to between ten and twenty seconds. These values are stored in the memory 96 (see FIG. 1) of the control section 94 in advance. The necessary times for the other cassette tables 36B and 36C, and the other load-lock chamber 30B of the processing apparatus 24B are also defined and stored in the memory 96, as described above. The process times in the process chambers 32A and 32B depend on process contents, and they are several minutes in general.

The present embodiment is conceived to prevent the transfer arm 90 or 92 of the common transfer mechanism 40, as far as possible, from staying on standby along with a wafer held thereon for a long time. This is so because, if the transfer arm 90 or 92 stays on standby along with a wafer held thereon, it cannot be instantly available to start transfer of a wafer to be subjected to another process, as described above.

More specifically, in the transfer flow of wafers W, an unprocessed wafer is first transferred from a cassette container to the orientor 52, and subjected to alignment, as described above. The aligned wafer is transferred to a load-lock chamber, and subjected to a predetermined process in the corresponding process chamber. The ordinary operations of the common transfer mechanism 40 include the following operations. Specifically, the common transfer mechanism 40 replaces wafers in the orientor 52, such that an empty one of the transfer arms, e.g., the transfer arm 90 picks up an aligned wafer from the orientor 52, and the other transfer arm 92 places a non-aligned wafer having been held thereon onto the orientor 52. Similarly, the common transfer mechanism 40 replaces wafers in a load-lock chamber, such that an empty one of the transfer arms, e.g., the transfer arm 92 picks up a processed wafer from the load-lock chamber, and the other transfer arm 90 places an aligned wafer having been held thereon onto the load-lock chamber.

Incidentally, when a wafer is to be transferred from a cassette container, there are cases where the orientor 52 is occupied by a wafer, and where the orientor 52 is not occupied by a wafer but empty. Accordingly, whether the wafer should start being transferred from the cassette container is judged separately between the case of the orientor 52 being empty (no wafer), and the case of the orientor 52 being occupied by a wafer.

<Total Transfer Time Tr Where the Orientor 52 is Occupied by a Wafer>

The case of the orientor being occupied by a wafer occurs as follows. For example, this occurs where wafers from the same cassette container are being sequentially processed. This also occurs where wafers from a plurality of cassette containers are being processed in parallel, e.g., such that wafers from the cassette container 38A are processed in the processing apparatus 24A while wafers from the cassette container 38B are processed in the processing apparatus 24A or 24B. In the conditions described above, a wafer previously transferred and aligned is placed on standby in the orientor 52. The total transfer time where the orientor 52 is occupied by a wafer is a time to transfer a wafer from the cassette table 36A to the orientor, and to transfer the former wafer already aligned from the orientor to the load-lock chamber 30A.

The total transfer time Tr (see FIG. 4) in this case is expressed by the following formula 1.

$$Tr = T(CX\text{-}LP) + T(LP\text{-}OUT) + T(LP\text{-}ORT) + T(ORT) + T(ORT\text{-}LLM) \quad (1)$$

Specifically, the total transfer time Tr is a time necessary for the common transfer mechanism 40 to perform the sequential operations, i.e., to move from the current position to the cassette table 36A (T(CX-LP)); to pick up or take out an unprocessed wafer from the cassette table 36A (T(LP-OUT); to move to the orientor 52 while holding this wafer (T(LP-ORT)); to replace an aligned wafer with this wafer in the orientor 52 (T(ORT)); and to transfer this aligned wafer to the load-lock chamber 36A (T(ORT-LLM)).

<Total Transfer Time Tr Where the Orientor 52 is not Occupied by a Wafer>

The case of the orientor being not occupied by a wafer occurs as follows. For example, this occurs where the last wafer from a cassette container previously set is being processed in a processing apparatus, or the last wafer is completely processed and returned to the cassette container, while a new cassette container is set on a cassette table. Since the orientor 52 is not occupied by a wafer, the total transfer time in the case is a time necessary for the common transfer mechanism 40 to transfer a wafer from a new cassette container (the cassette container 38A in the embodiment shown in FIG. 4) into the orientor 52; then to transfer a wafer (second wafer) to the orientor 52 from a cassette container (the cassette container 38C in the embodiment shown in FIG. 4) on the cassette table farthest from the orientor 52; and to transfer the wafer already aligned (first wafer) to the load-lock chamber 30A.

Next, an explanation will be give of the reason as to why it should be considered to transfer a wafer from a cassette container 38C on the cassette table farthest from the orientor 52.

Where the total transfer time Tr is obtained on the condition that a wafer transferred not from the cassette container 38C but from the cassette container 38A, the timing to start transferring the wafer from the cassette container is determined, based on comparison between the total transfer time and remaining process time, as described above. There may be a state where two wafers have been transferred from the cassette container 38A, and another new cassette container 38C is set immediately thereafter. It is assumed that the cassette container 38C stores wafers to be processed in the other processing apparatus 24B, and the processing apparatus 24B is not occupied. In this case, although these wafers could be immediately processed in the processing apparatus 24B, the wafers have to stay on standby for the process, until the second wafer from the cassette container 38A is transferred into the processing apparatus 24A.

In order to solve this problem, in consideration of the possibility of another new cassette container being set, the total transfer time Tr is set to include a time to transfer a wafer from the cassette container 38C on the cassette table farthest from the orientor 52. In this case, the "farthest position" is chosen, because, when the timing to start transferring a wafer from a cassette container is determined, there is no idea as to which cassette table will receive another new cassette container. In practice, if there is no other new cassette container being set when a wafer is picked up from the cassette container 38A, the second wafer is also picked up from the cassette container 38A.

The total transfer time Tr (see FIG. 4) in this case is expressed by the following formula 2.

$$Tr = T(CX\text{-}LP) + T(LP\text{-}OUT) + T(LP\text{-}ORT) + T(ORT\text{-}IN) + T(ORT\text{-}LPMAX) + T(LP\text{-}OUT) + T(ORT\text{-}LPMAX) + T(ORT) + T(ORT\text{-}LLM) \quad (2)$$

Specifically, the total transfer time Tr is a time necessary for the common transfer mechanism 40 to perform the sequential operations, i.e., to move from the current position to the cassette table (T(CX-LP)); to pick up or take out an unprocessed wafer from the cassette table (T(LP-OUT); to move to the orientor 52 while holding this wafer (T(LP-ORT)); to transfer the wafer into the orientor 52 (T(ORT- IN)); then to move from the orientor 52 to the farthest cassette table 36C (T(ORT-LPMAX)); to take out an unprocessed wafer from the cassette table 36C (T(LP-OUT)); to move to the orientor 52 while holding this wafer (T(ORT-LPMAX)); to replace an aligned wafer with this wafer in the orientor 52 (T(ORT)); and to transfer this aligned wafer to the load-lock chamber (T(ORT-LLM)).

Next, an explanation will be given of judgment on the total transfer time Tr.

<Judgment>

When the total transfer time Tr satisfies the following formula 3, no wafer starts being transferred from a cassette container.

$$[\text{Remaining process time}]-[\text{Total transfer time }(Tr)] > [\text{Preset time (Preset value)}] \qquad (3)$$

In this formula, the remaining process time is a time necessary until the process on a wafer currently processed is complete and the wafer is ready for transfer from the processing apparatus. The remaining process time thus gradually decreases with progress of the process. Where the orientor is occupied by a wafer, the remaining process time concerning a processing apparatus to which the wafer is transferred is the remaining process time in the formula 3. Where the orientor is not occupied by a wafer, the remaining process time concerning a processing apparatus to which a wafer from a cassette container is transferred is the remaining process time in the formula 3.

The value of [Remaining process time]-[Total transfer time (Tr)] corresponds to a time for the common transfer mechanism 40 to stay on standby with an aligned wafer held thereon, immediately in front of the corresponding load-lock chamber. Where the value of [Remaining process time]-[Total transfer time (Tr)] is negative, this can be considered as a time for a processing apparatus to wait for arrival of a new wafer while being empty. In general, this preset time falls within a range of about −3 to 10 seconds.

As described above, where a new cassette container with wafers to be processed in another empty processing apparatus is set, the wafers in the cassette container need to wait only for the remaining process time concerning a processing apparatus to which a wafer from the orientor is transferred. Accordingly, it is possible to prevent a problem in that the common transfer mechanism 40 stays on standby in front of the processing apparatus (i.e., in front of the load-lock chamber), while holding a wafer to be processed next in the processing apparatus, until the processing apparatus is ready for receiving a wafer.

As described above, where the difference between the remaining process time and total transfer time is larger than the preset time, if an unprocessed wafer starts being transferred under the circumstances, the common transfer mechanism 40 has to wait immediately in front of the load-lock chamber while holding the unprocessed wafer. Accordingly, the common transfer mechanism 40 does not start transferring but stays in the empty state at the last position to which it has moved in the preceding step. In this state, if a request to start transferring a set of wafers for another process is made, the common transfer mechanism 40 can swiftly shift to an operation to transfer a wafer from a new cassette container.

On the other hand, where the total transfer time Tr satisfies the following formula 4, since a time for the common transfer mechanism 40 to wait immediately in front of the load-lock chamber while holding an unprocessed wafer is shorter than the preset time, it immediately starts transferring the next wafer from a cassette container.

$$[\text{Remaining process time}]-[\text{Total transfer time }(Tr)] \leq [\text{Preset time (preset value)}] \qquad (4)$$

The symbol of equality "=" in the formula 4 may be added to the formula 3.

In place of the formulas 3 and 4, the following formulas 3' and 4' may be used.

$$[\text{Remaining process time}]/[\text{Total transfer time }(Tr)] > [\text{Preset value}] \qquad (3')$$

$$[\text{Remaining process time}]/[\text{Total transfer time }(Tr)] \leq [\text{Preset value}] \qquad (4')$$

When the orientor 52 is occupied by the last unprocessed wafer while the other wafers in a cassette container have been processed, the timing to start transferring the aligned wafer from the orientor 52 is determined as follows.

<Total Transfer Time Tr When the Orientor 52 is Occupied by a Wafer While No Wafer is Left in the Cassette Container>

The total transfer time Tr in this case is expressed by the following formula 5, with reference to FIG. 5.

$$Tr=T(CX\text{-}ORT)+T(ORT\text{-}OUT)+T(ORT\text{-}LLM) \qquad (5)$$

Specifically, the total transfer time Tr is a time necessary for the common transfer mechanism 40 to perform the sequential operations, i.e., to move from the current position to the orientor 52 (T(CX-ORT)); to take out an aligned wafer from the orientor 52 (T(ORT-OUT)); and to transfer this aligned wafer to the load-lock chamber (T(ORT-LLM)).

The judgment formula is the same as in the cases of the formulas 3 and 4. Specifically, while the formula 3 is satisfied, a wafer in the orientor is not transferred, and when the formula 4 is satisfied, the wafer in the orientor starts being transferred. When a new cassette container is set before the wafer in the orientor starts being transferred, the total transfer time Tr is calculated from the formula 1, so that the timing to start transferring a wafer from a cassette container is determined.

As described above, according to the present embodiment, the next unprocessed wafer does not start being transferred as long as temporally possible when a wafer is being processed, so as to ensure that the common transfer mechanism 40 is in a free state for a long time. This makes it possible for the common transfer mechanism 40 to swiftly be ready for a wafer for another process, which may newly start being transferred. In this case, the throughput of the process currently performed in a processing apparatus is not lowered. Furthermore, it can be ready without delay for the start of transfer of a wafer to be subjected to another process. As a result the throughput can remarkably improve as a whole.

The explanation described above mainly takes a case where a wafer is transferred from the cassette container 38A on the cassette table 36A, and is processed in the processing apparatus 24A. Similarly, for other cases where a wafer is transferred from each of the cassette tables 36A, 36B, and 36C, and is processed in each of the processing apparatus 24A and 24B, the respective transfer times are preset, as described above, and are stored in the memory 96.

Where a plurality of processing apparatuses are in operation, the remaining process time is administered for every processing apparatus in operation. Where cassette containers are placed on a plurality of waiting ports, the total transfer time is administered for every waiting port with a cassette container placed thereon.

In the processing system according to the embodiment, the processing apparatuses 24A and 24B, which respectively have the load-lock chambers 30A and 30B and the process chambers 32A and 32B connected thereto, are disposed onto the laterally long box-like common transfer chamber 28. The common transfer chamber 28 is provided with the transfer mechanism 40 slidably arranged therein. However, the present invention is not limited to such a structure, and it may be applied to a processing system having a different structure.

Figure 6:
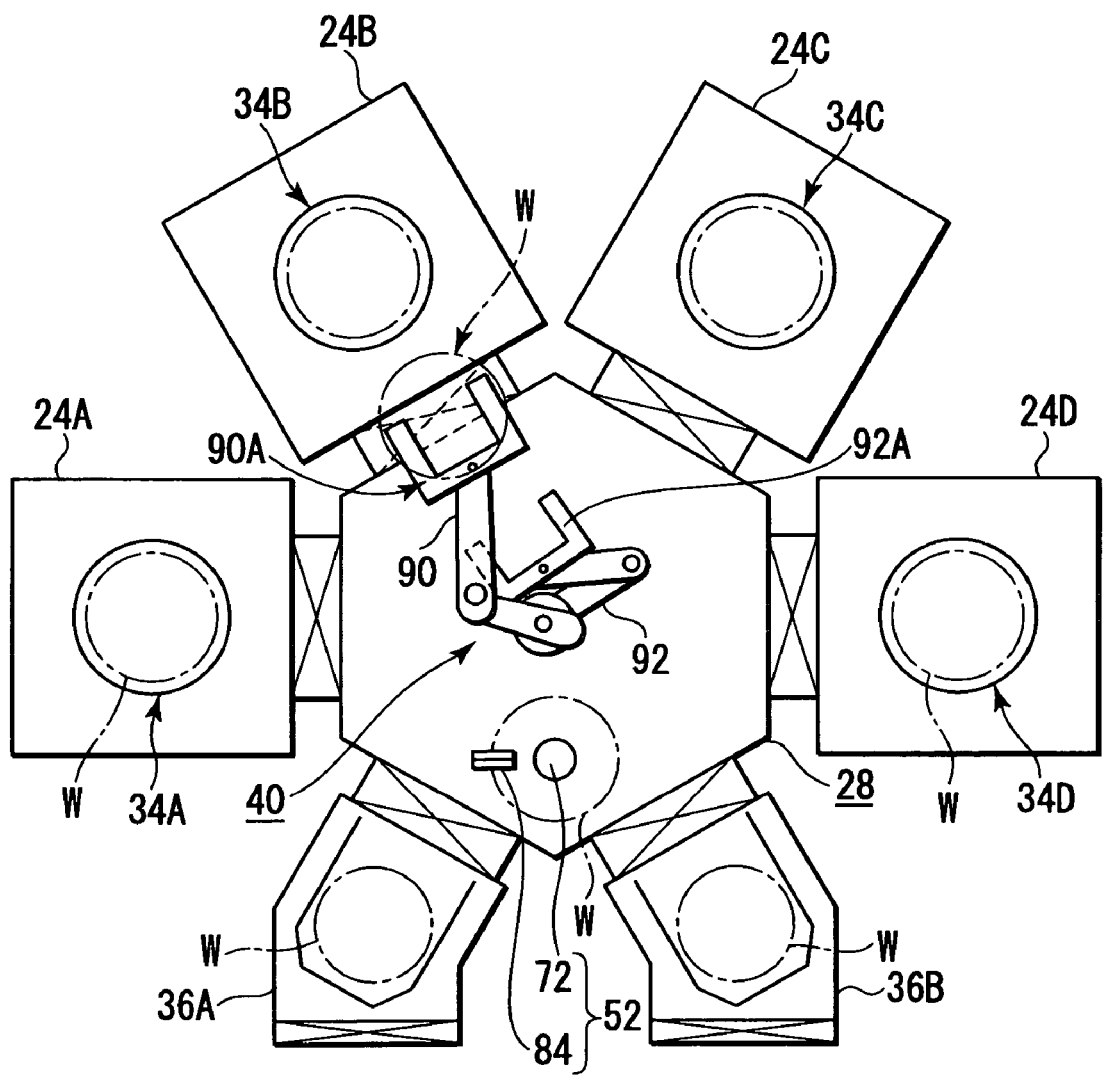
FIG. 6 is a structural diagram schematically showing a semiconductor processing system for processing a target object, according to another embodiment of the present invention.
Figure 7:
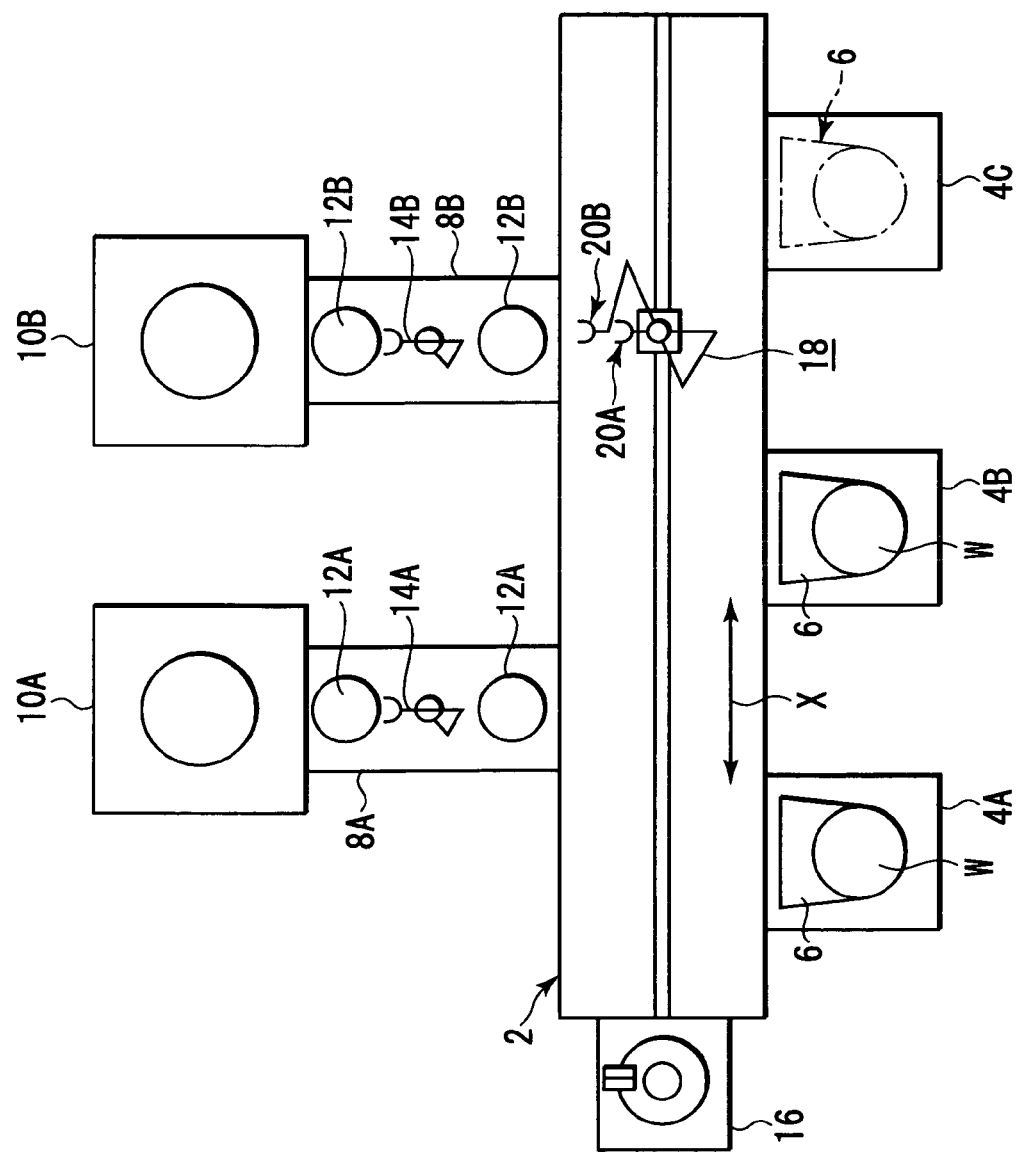
FIG. 7 is a structural diagram schematically showing a conventional processing system for processing a target object.

FIG. 6 is a structural diagram schematically showing a semiconductor processing system for processing a target object, according to another embodiment of the present invention. As shown in FIG. 6, a polygonal, e.g., hexagonal, common transfer chamber 28 is provided with a transfer mechanism 40 similar to that shown in FIG. 1 (but not slidable in the X direction), at the center. Four processing apparatuses 24A to 24D and two chamber cassette tables 36A and 36B are disposed around the common transfer chamber 28. According, the processing system shown in FIG. 6 is of the so-called cluster tool type. In the hexagonal common transfer chamber 28, there is an orientor 52 having a reference table 72 and an optical sensor 84.

In this case, the remaining process time becomes shorter by an amount for load-lock chambers being excluded. Transfer times to transfer wafer from the two cassette tables 36A and 36B to the orientor 52 are the same. This embodiment can also provide the effects as described above.

As described above, the present invention may be applied to a processing system of the so-called cluster tool type, which has a plurality of processing apparatuses and an orientor connected to the sides of a polygonal, e.g., rectangular or hexagonal, common transfer chamber. The present invention may be applied to a processing system having a common transfer chamber with an orientor disposed therein. The present invention may be applied to a processing system having no orientor 52, such that a wafer is transferred directly from a cassette table to a processing apparatus. Furthermore, the present invention may be applied to a processing system, which includes, in place of the orientor 52, a light emitter and a light receiver respectively disposed on the top and bottom plates of a common transfer chamber, for detecting a wafer position displacement. In this case, a wafer position displacement is detected on the way of the wafer being transferred by a common transfer mechanism from a cassette table to a processing apparatus.

In the processing systems according to the embodiments described above, the common transfer mechanism 40 is provided with two transfer arms 90 and 92. The present invention may be applied to a processing system, which has a common transfer mechanism provided with only one transfer arm. In the present invention, the target object is not limited to a semiconductor wafer W, and it may be another target objects, such as a grass substrate, or an LCD substrate.

What is claimed is:

1. A method of transferring a target object in a semiconductor processing system, the system including
   a plurality of processing apparatuses configured to subject target objects to processes of different kinds,
   a plurality of waiting ports configured to put the target objects on standby,
   an alignment device configured to subject the target objects to alignment, and
   a common transfer mechanism configured to transfer the target objects between the plurality of processing apparatuses, the plurality of waiting ports, and the alignment device,
   the method comprising, while a first target object is processed in a first processing apparatus, as one of the processing apparatuses:
   performing information processing, using
   a remaining process time to complete a process on the first target object in the first processing apparatus, and to make the first target object ready for transfer from the first processing apparatus, and
   a total transfer time, which includes a first partial transfer time to transfer one of the target objects from a first waiting port, as one of the waiting ports, to the alignment device, and a second partial transfer time to transfer one of the target objects from the alignment device to a waiting position for the first processing apparatus; and
   starting transfer of a new target object from the first waiting port toward the waiting position for the first processing apparatus, based on a result of the information processing.

2. A method of transferring a target object in a semiconductor processing system, the system including
   a plurality of processing apparatuses configured to subject target objects to processes of different kinds,
   a plurality of waiting ports configured to put the target objects on standby, and
   a common transfer mechanism configured to transfer the target objects between the plurality of processing apparatuses and the plurality of waiting ports,
   the method comprising, while a first target object is processed in a first processing apparatus, as one of the processing apparatuses:
   performing information processing, using
   a remaining process time to complete a process on the first target object in the first processing apparatus, and to make the first target object ready for transfer from the first processing apparatus, and
   a total transfer time to take out one of the target objects from a first waiting port, as one of the waiting ports, and to transfer said one of the target objects to a waiting position for the first processing apparatus; and
   starting transfer of a new target object from the first waiting port toward the waiting position for the first processing apparatus, based on a result of the information processing.

3. The method according to claim 1, wherein the common transfer mechanism has a plurality of transfer arms, which are independently extensible/contractible and swingable, and the total transfer time includes a replacement time to replace a target object with another target object in the alignment device by the transfer arm.

4. The method according to claim 1 or 2, wherein the total transfer time includes an initial travel time for the common transfer mechanism to move from a current position to the first waiting port.

5. The method according to claim 1 or 2, wherein the total transfer time includes a pickup time to pick up one of the target objects from the first waiting port.

6. The method according to claim 1, comprising, when no target object to be processed is present in the waiting port, and the alignment device is occupied by a second target object:
   performing information processing, using the remaining process time and the second partial transfer time; and
   starting transfer of the second target object from the alignment device toward the waiting position for the first processing apparatus, based on a result of the information processing.

7. The method according to claim 1, wherein, when the alignment device is occupied by a second target object, the first processing apparatus is a processing apparatus for processing the second target object, and when the alignment device is occupied by no target object, the first processing apparatus is a processing apparatus for processing the new target object picked up from the first waiting port.

8. The method according to claim 1, wherein, when the alignment device is occupied by no target object, the total transfer time includes a time for the common transfer mechanism to reciprocate between the alignment device and a waiting port farthest from the alignment device.

9. The method according to claim 1 or 2, wherein the remaining process time is administered for each of the processing apparatuses, and the total transfer time is administered for each of the waiting ports.

10. The method according to claim 1 or 2, wherein the information processing is performed by comparing a value representing difference or ratio between the remaining process time and the total transfer time with a preset value.

11. A semiconductor processing system, comprising:
a plurality of processing apparatuses configured to subject target objects to processes of different kinds;
a plurality of waiting ports configured to put the target objects on standby;
an alignment device configured to subject the target objects to alignment;
a common transfer mechanism configured to transfer the target objects between the plurality of processing apparatuses, the plurality of waiting ports, and the alignment device; and
a control section configured to control operations of the common transfer mechanism,
wherein the control section comprises, while a first target object is processed in a first processing apparatus, as one of the processing apparatuses,
performing information processing, using
a remaining process time to complete a process on the first target object in the first processing apparatus, and to make the first target object ready for transfer from the first processing apparatus, and
a total transfer time, which includes a first partial transfer time to transfer one of the target objects from a first waiting port, as one of the waiting ports, to the alignment device, and a second partial transfer time to transfer one of the target objects from the alignment device to a waiting position for the first processing apparatus, and
starting transfer of a new target object from the first waiting port toward the waiting position for the first processing apparatus, based on a result of the information processing.

12. A semiconductor processing system, comprising:
a plurality of processing apparatuses configured to subject target objects to processes of different kinds;
a plurality of waiting ports configured to put the target objects on standby;
a common transfer mechanism configured to transfer the target objects between the plurality of processing apparatuses and the plurality of waiting ports; and
a control section configured to control operations of the common transfer mechanism,
wherein the control section comprises, while a first target object is processed in a first processing apparatus, as one of the processing apparatuses,
performing information processing, using
a remaining process time to complete a process on the first target object in the first processing apparatus, and to make the first target object ready for transfer from the first processing apparatus, and
a total transfer time to take out one of the target objects from a first waiting port, as one of the waiting ports, and to transfer said one of the target objects to a waiting position for the first processing apparatus, and
starting transfer of a new target object from the first waiting port toward the waiting position for the first processing apparatus, based on a result of the information processing.

13. The system according to claim 11 or 12, wherein the control section performs the information processing by comparing a value representing difference or ratio between the remaining process time and the total transfer time with a preset value.

* * * * *